(12) United States Patent
Shih et al.

(10) Patent No.: US 6,670,692 B1
(45) Date of Patent: Dec. 30, 2003

(54) SEMICONDUCTOR CHIP WITH PARTIALLY EMBEDDED DECOUPLING CAPACITORS

(75) Inventors: Ching-chang Shih, Tainan (TW); Chun-an Tu, Tainan (TW); Tsung-chi Hsu, Changhua (TW); Wei-feng Lin, Hsinchu (TW); Ming-huan Lu, Hsinchu (TW)

(73) Assignee: Silicon Integrated Systems Corp. (TW)

( * ) Notice: Subject to any disclaimer, the term of this patent is extended or adjusted under 35 U.S.C. 154(b) by 0 days.

(21) Appl. No.: 10/268,293

(22) Filed: Oct. 9, 2002

(51) Int. Cl.[7] .............................................. H01L 29/00
(52) U.S. Cl. ................... 257/532; 257/535; 257/723; 361/306.2; 361/306.3; 361/311
(58) Field of Search .................. 361/306.2, 306.3, 361/311; 257/532, 728, 725, 724, 723, 777, 535

(56) References Cited

U.S. PATENT DOCUMENTS 6,165,814 A * 12/2000 Wark et al. .................. 438/108
6,342,724 B1 * 1/2002 Wark et al. .................. 257/532
6,404,615 B1 * 6/2002 Wijeyesekera et al. .. 361/306.1

* cited by examiner

Primary Examiner—Nathan J. Flynn
Assistant Examiner—Pershelle Greene
(74) Attorney, Agent, or Firm—Martine & Penilla, LLP

(57) ABSTRACT

A partially embedded decoupling capacitor is provided as an integral part of a semiconductor chip for reducing delta-I noise. The semiconductor chip includes a plurality of embedded metal layers, a passivation layer formed above the plurality of embedded metal layers as a topmost layer of the semiconductor chip, and a plurality of bonding pads disposed on the passivation layer. A surface planar metal pattern is formed on the passivation layer and electrically connected to one of the plurality of embedded metal layers through one of the plurality of bonding pads or a via hole opened on the passivation layer. For example, the surface planar metal pattern may be connected to a power layer or a ground layer of the semiconductor chip. Therefore, the partially embedded decoupling capacitor is made up of the surface planar metal pattern as an electrode, others of the plurality of embedded metal layers as opposite electrodes, and the passivation layer sandwiched therebetween as a dielectric layer. Since connected to one of the plurality of embedded metal layers, the surface planar metal pattern further serves as a heat sink for dissipating heat directly from the inside of the semiconductor chip.

16 Claims, 6 Drawing Sheets

SEMICONDUCTOR CHIP WITH PARTIALLY EMBEDDED DECOUPLING CAPACITORS

BACKGROUND OF THE INVENTION

1. Field of the Invention

The present invention relates to a semiconductor chip and, more particularly, to a semiconductor chip integrated with partially embedded decoupling capacitors for reducing delta-I noise during operations.

2. Description of the Related Art

In a normal configuration of semiconductor chips, power lines and ground lines are routed to logic gates in integrated circuits. External power supply provides current which flows from the power lines, through the logic gates, and finally into the ground lines. During the switching of the logic gates, a large amount of change in the current occurs within a short period of time. The change in the current causes delta-I noise in the voltage of the power and ground lines due to the resistive, capacitive, and possible inductive nature of the semiconductor chip.

This phenomenon becomes more remarkable for semiconductor chips with a high integration density of circuits at a high-speed operation. More specifically, in the field of deep sub-micro processing technology, the power supply voltage is reduced to a lower level, resulting in increasing susceptibility of the semiconductor chips with the high integration density of circuits to the delta-I noise. In this case, the delta-I noise has a direct, adverse effect on the maximum operating frequency of the semiconductor chips.

FIG. 1 is a top view showing a normal semiconductor chip mounted on a lead frame. As shown in FIG. 1, a semiconductor chip 10 is provided with a plurality of bonding pads 11 thereon. The bonding pads 11 are formed on a passivation layer 12, which is the topmost layer of the semiconductor chip 10, and connected with underlying, corresponding embedded metal layers (not shown) of the semiconductor chip 10 through via holes opened on the passivation layer 12. Each of the bonding pads 11 is connected to a corresponding terminal 13 of a lead frame 14 through a bonding wire 15.

FIG. 2 is a circuit diagram showing an equivalent circuit of FIG. 1. As shown in FIG. 2, symbol $V_s$ represents an external DC voltage supply on a motherboard (not shown) for supporting the lead frame 14. Symbols $R_t$ and $L_p$ represent an equivalent resistance and inductance between the external DC voltage supply $V_s$ and the lead frame 14, respectively. Each of symbols $C_{p1}$ and $C_{p2}$ represent a mid-frequency decoupling capacitor. Regarding to the bonding wires 15, each of them has an equivalent resistance $R_w$ and inductance $L_w$ as well as an equivalent resistance $R_c$ in connection with two adjacent bonding wires 15. Regarding to the semiconductor chip 10, symbol $I_p$ represents the current flowing in the semiconductor chip 10 from power lines VDD to ground lines VSS while symbol $C_{comp}$ represents a built-in high-frequency decoupling capacitor.

As clearly seen from FIG. 2, the bonding wires 15 have equivalent inductances $L_w$, which causes the delta-I noise during the switching of the logic gates formed inside the semiconductor chip 15. More specifically, when the logic gates switch, the change in current $\left(\text{referred to as } \frac{di}{dt}\right)$ develops a voltage (referred to as Δv) expressed by the following equation:

$$\Delta v = L_w \frac{di}{dt}$$

Such instability of voltage caused by the delta-I noise deteriorates the quality of power supply delivering to the semiconductor chip 10 and thus suppresses the possibility of high-speed operations.

As a countermeasure against the delta-I noise, decoupling capacitors have been suggested to be inserted between the semiconductor chip 10 and the bonding wires 15.

FIG. 3 is a top view showing a semiconductor chip with conventional decoupling capacitors. As shown in FIG. 3, two multi-layer ceramic capacitors (MLCCs) 16 are used as the decoupling capacitors, for example. Each of the MLCCs 16 is connected in series between the power pad and ground pad of the semiconductor chip 15. The equivalent circuit of each of the MLCCs 16 includes a resistance $R_g$, an inductance $L_g$, and a capacitance $C_g$, connecting in series with each other, as shown in FIG. 4. Although the addition of the MLCCs 16 reduces the delta-I noise well, there are at least two shortcomings regarding to the use of the MLCCs 16. First, it is necessary to bond the MLCCs 16 onto the pads of the semiconductor chip 10. Such bonding of the MLCCs does not only increase overall processing steps but also deteriorates the reliability of the semiconductor chip 10. Besides, the delta-I noise reducing efficiency of the MLCCs 16 is inevitably restrained by the equivalent inductance $L_g$ thereof.

To avoid these shortcomings, a conventional metal-insulator-metal (MIM) process is employed to form another type of decoupling capacitor. Typically, the semiconductor chip with a high integration density of circuits includes a plurality of embedded metal layers separated by insulator layers. Two of these metal layers, e.g., an $n^{th}$ metal layer and $(n-1)^{th}$ metal layer in an n-metal-layer chip structure, are used as power and ground metal layers, respectively. According to the MIM process, an additional metal layer is embedded in one insulator layer between the power and ground metal layers to work together with the ground metal layer as a decoupling capacitor. FIG. 5 is a circuit diagram showing an equivalent circuit of a semiconductor chip with an MIM decoupling capacitor 17. Although the use of the MIM decoupling capacitor 17 has an advantage of eliminating the equivalent inductance compared with the use of the MLCC, the manufacturing process of the semiconductor chip becomes more complicated due to the formation of the MIM decoupling capacitor 17.

SUMMARY OF THE INVENTION

In view of the above-mentioned problems, an object of the present invention is to provide a semiconductor chip capable of reducing the delta-I noise by means of a decoupling capacitor without equivalent inductance.

Another object of the present invention is to provide a semiconductor chip capable of reducing the delta-I noise by means of a decoupling capacitor being fabricated without changing the original circuit layout and manufacturing process of the semiconductor chip.

Still another object of the present invention is to provide a semiconductor chip capable of reducing the delta-I noise by means of a decoupling capacitor being fabricated at low cost and high reliability.

According to the present invention, a partially embedded decoupling capacitor is provided as an integral part of a semiconductor chip for reducing the delta-I noise. The semiconductor chip includes a plurality of embedded metal layers, a passivation layer formed above the plurality of embedded metal layers as a topmost layer of the semiconductor chip, and a plurality of bonding pads disposed on the passivation layer. A surface planar metal pattern is formed on the passivation layer and electrically connected to one of the plurality of embedded metal layers through one of the plurality of bonding pads or a via hole opened on the passivation layer at a location separated from the plurality of bonding pads. For example, the surface planar metal pattern may be connected to a power layer or a ground layer of the semiconductor chip.

Therefore, a partially embedded decoupling capacitor is made up of the surface planar metal pattern as an electrode, others of the plurality of embedded metal layers as opposite electrodes, and the passivation layer sandwiched therebetween as a dielectric layer. Since connected to one of the plurality of embedded metal layers, the surface planar metal pattern further serves as a heat sink for dissipating heat directly from the inside of the semiconductor chip.

The partially embedded decoupling capacitor according to the present invention is easy to fabricate without changing the original circuit layout and manufacturing process of the semiconductor chip. As a result, the production cost is reduced and the reliability of the decoupling capacitor is enhanced. In addition, the equivalent inductance is eliminated since the decoupling capacitor is made as an integral part of the semiconductor chip without any bonding wires between the semiconductor chip and the decoupling capacitor.

The semiconductor chip with partially embedded decoupling capacitors according to the present invention may be mounted on a lead frame having a plurality of terminals in such a way that the plurality of bonding pads are electrically connected to the plurality of terminals. For example, the plurality of bonding pads may be electrically connected to the plurality of terminals through a plurality of bonding wires. Therefore, an electronic packaging structure is obtained by covering an encapsulation mold over the lead frame to encapsulate the semiconductor chip.

BRIEF DESCRIPTION OF THE DRAWINGS

The above-mentioned and other objects, features, and advantages of the present invention will become apparent with reference to the following descriptions and accompanying drawings, wherein.

DETAILED DESCRIPTION OF THE PREFERRED EMBODIMENTS

The preferred embodiments according to the present invention will be described in detail with reference to the drawings.

Figure 6A:
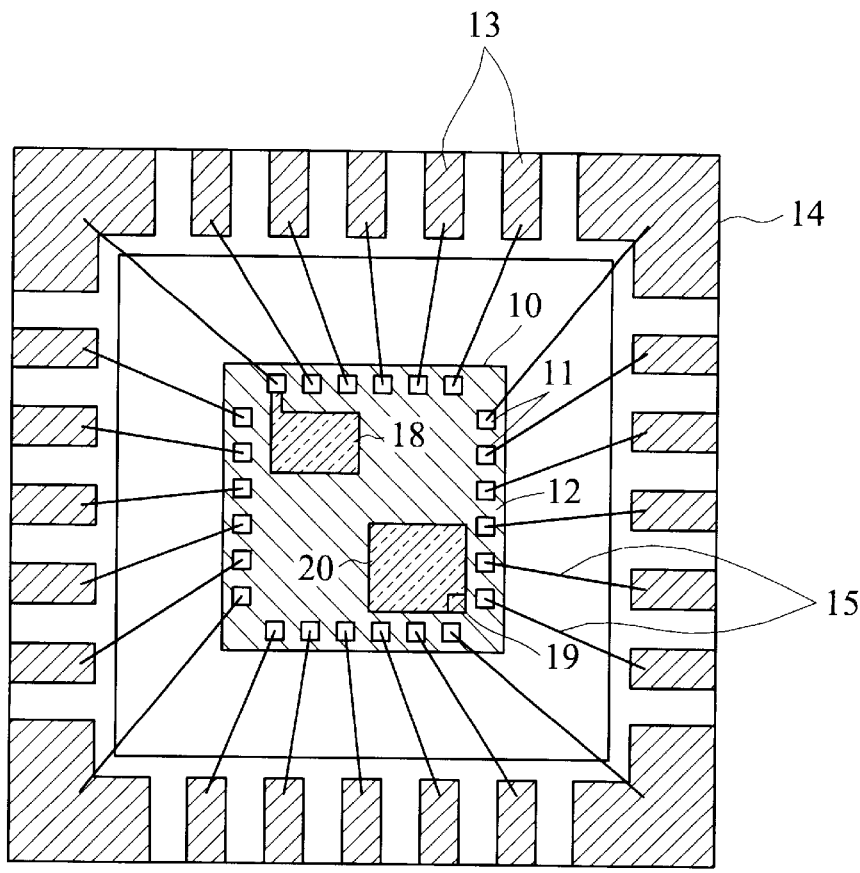
FIGS. 6(a) and 6(b) are a top view and a three-dimensional perspective view showing a semiconductor chip with partially embedded decoupling capacitors according to the present invention.
Figure 6B:
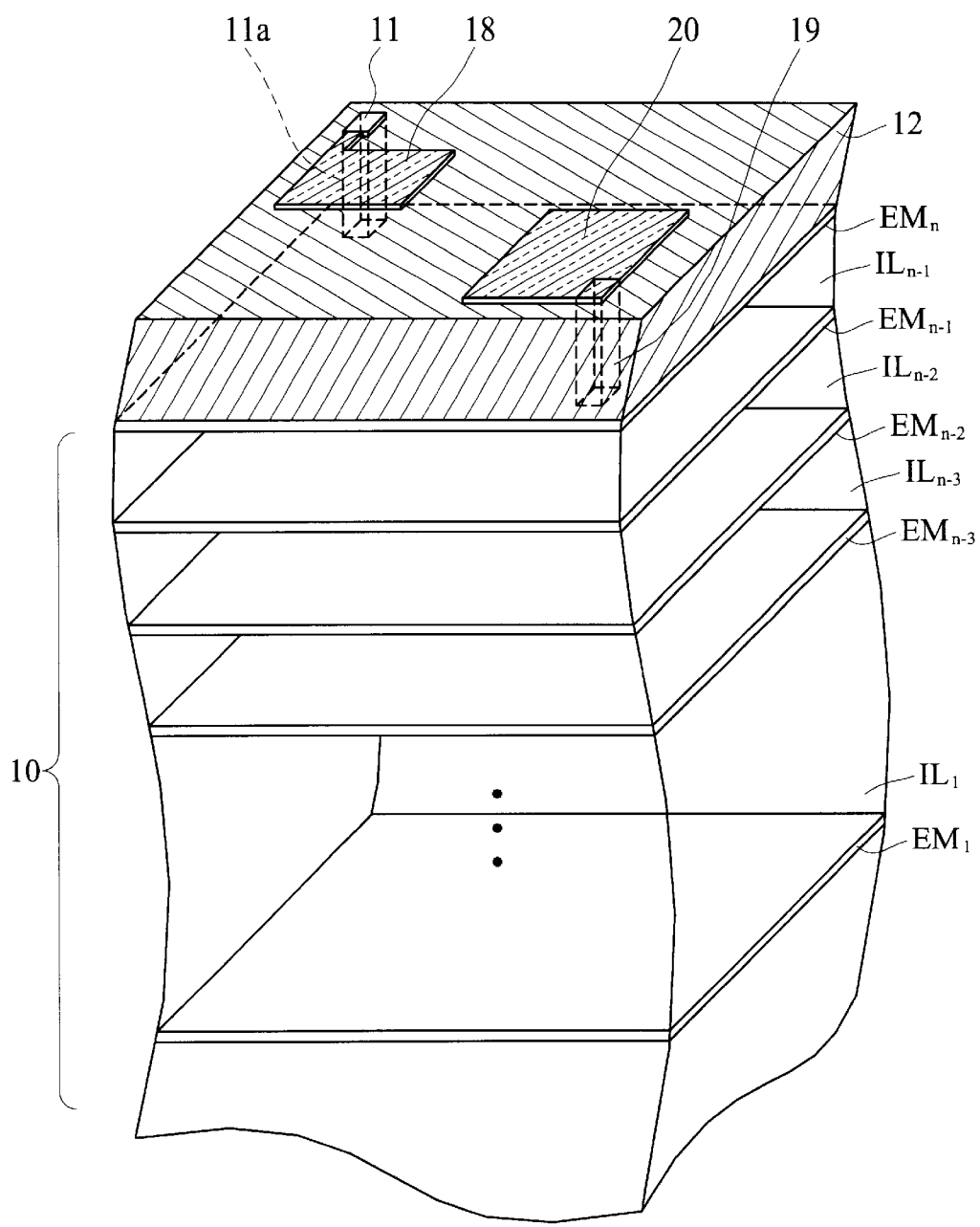

FIGS. 6(a) and 6(b) show a top view and a three-dimensional perspective view of a semiconductor chip with partially embedded decoupling capacitors according to the present invention. As shown in FIGS. 6(a) and 6(b), a semiconductor chip 10 is provided with a plurality of bonding pads 11 thereon. The bonding pads 11 are formed on a passivation layer 12, which is a topmost layer of the semiconductor chip 10, and connected with underlying, corresponding embedded metal layers $EM_1$ to $EM_n$ of the semiconductor chip 10 through via holes 11a opened on the passivation layer 12. Each of the bonding pads 11 is connected to a corresponding terminal 13 of a lead frame 14 through a bonding wire 15.

According to the present invention, a surface planar metal pattern 18 is formed on the passivation layer 12 by sputtering, printing, or depositing. Furthermore, the surface planar metal pattern 18 is formed to contact with a bonding pad 11. As described above, the semiconductor chip 10 with a high integration density of circuits typically includes a plurality of embedded metal layers $EM_1$ to $EM_n$ separated by insulator layers $IL_1$ to $IL_{n-1}$. Two of the metal layers, e.g., an $n^{th}$ metal layer $EM_n$ and $(n-1)^{th}$ metal layer $EM_{n-1}$ in an n-metal-layer chip structure, are used as power and ground metal layers, respectively. In the case where the surface planar metal pattern 18 is connected to the power metal layer through the bonding pad 11, a decoupling capacitor is made up of the surface planar metal pattern 18 as an upper electrode, the passivation layer 12 and/or embedded insulator layers as a dielectric layer, and the ground metal layer as a lower electrode. On the other hand, in the case where the surface planar metal pattern 18 is connected to the ground metal layer through the bonding pad 11, a decoupling capacitor is made up of the surface planar metal pattern 18 as an upper electrode, the passivation layer 12 and/or embedded insulator layers as a dielectric layer, and the power metal layer as a lower electrode. In both cases, the lower electrode of the decoupling capacitor according to the present invention is embedded in the semiconductor chip 10 so the inventors have referred to this kind of decoupling capacitor as being "partially embedded."

Figure 7:
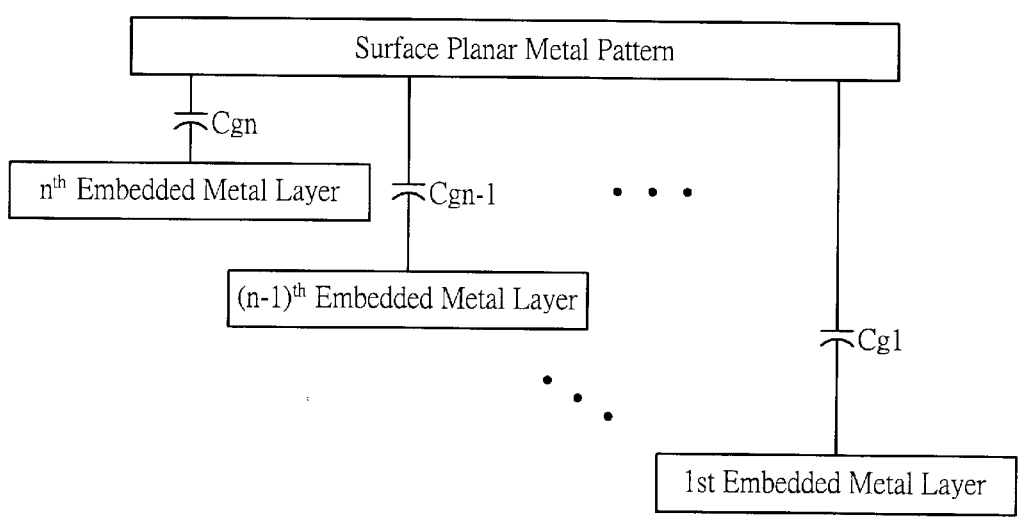
FIG. 7 is a circuit diagram showing an equivalent circuit of the partially embedded decoupling capacitor according to the present invention.

FIG. 7 is a circuit diagram showing an equivalent circuit of the partially embedded decoupling capacitor according to the present invention. As shown in FIG. 7, an equivalent capacitance $C_{gn}$ is formed between the surface planar metal pattern 18 and the embedded $n^{th}$ metal layer, an equivalent capacitance $C_{gn-1}$ is formed between the surface planar metal pattern 18 and the embedded $(n-1)^{th}$ metal layer, ..., and a equivalent capacitance $C_{g1}$ is formed between the surface planar metal pattern 18 and the embedded first metal layer.

Although the present invention has been described in conjunction with a particular embodiment that the surface planar metal pattern 18 serving as the upper electrode is connected to the bonding pad 11, it is not limited to this.

Referring to FIGS. 6(a) and 6(b), for example, a via hole 19 is opened on the passivation layer 12 at a location separated from the bonding pads 11 in the formation step of the passivation layer 12. The via hole 19 penetrates the passivation layer 12 down to expose one of the plurality of embedded metal layers, such as the power or ground metal layer. Next, a surface planar metal pattern 20 is formed to cover a region including the via hole 19 by sputtering, printing, or depositing and then fills the via hole 19. As a result, the surface planar metal pattern 20 is made in contact with the power or ground metal layer underneath the passivation layer 12 through the via hole 19.

The value of the equivalent capacitance of the partially embedded capacitor is determined by several factors such as the area of the surface planar metal pattern, the thickness of the passivation layer, and the area of the embedded metal layer underlying the surface planar metal pattern. In an embodiment of the present invention, a plurality of surface planar metal patterns with different shapes and areas are formed on the passivation layer to connect with either the power or ground metal layer through either bonding pads or via holes.

Figure 1:
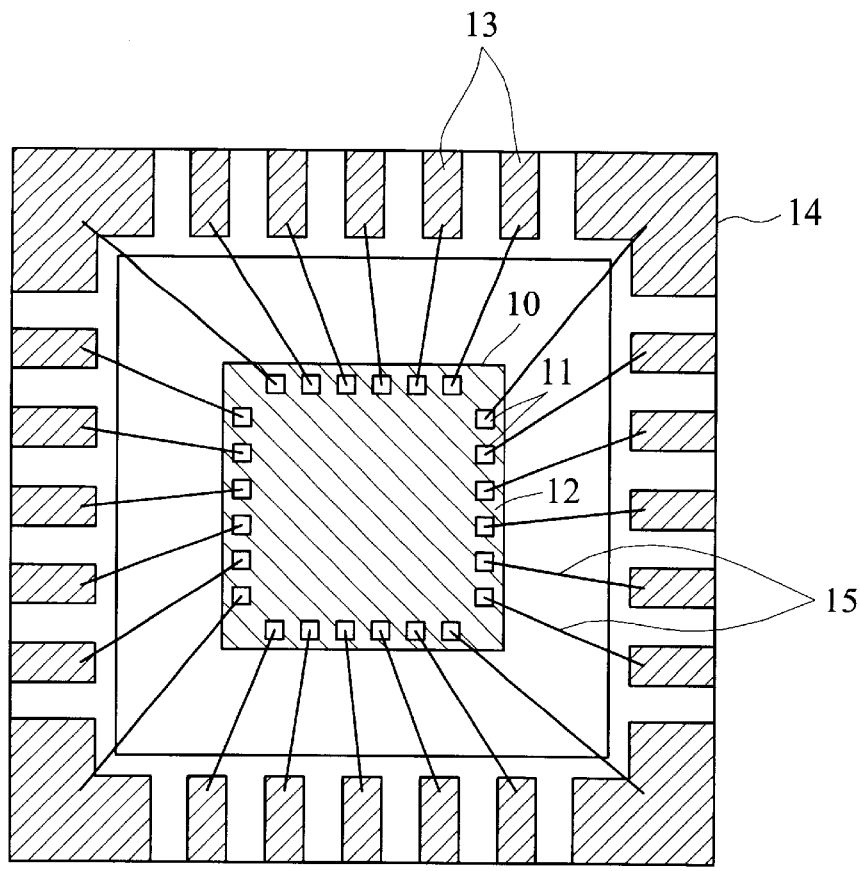
FIG. 1 is a top view showing a normal semiconductor chip mounted on a lead frame.
Figure 2:
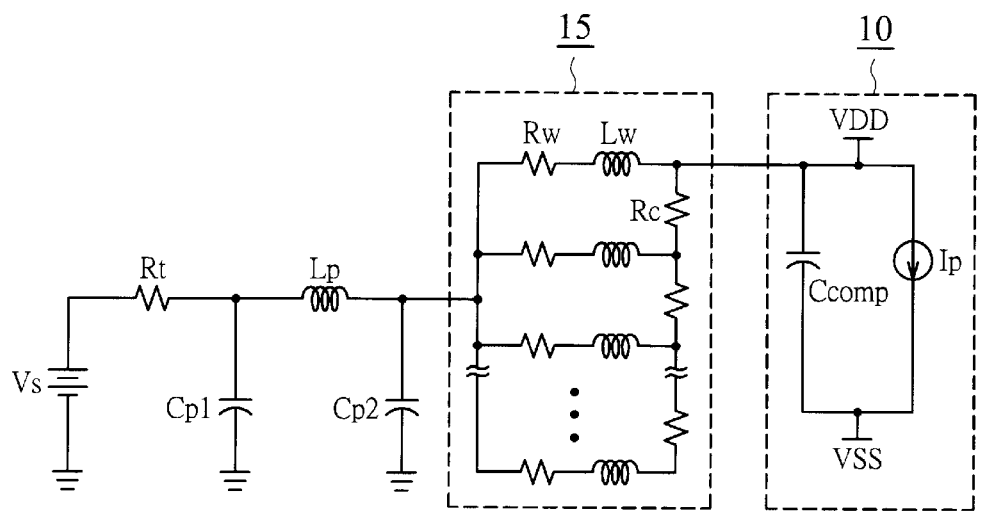
FIG. 2 is a circuit diagram showing an equivalent circuit of FIG. 1.
Figure 3:
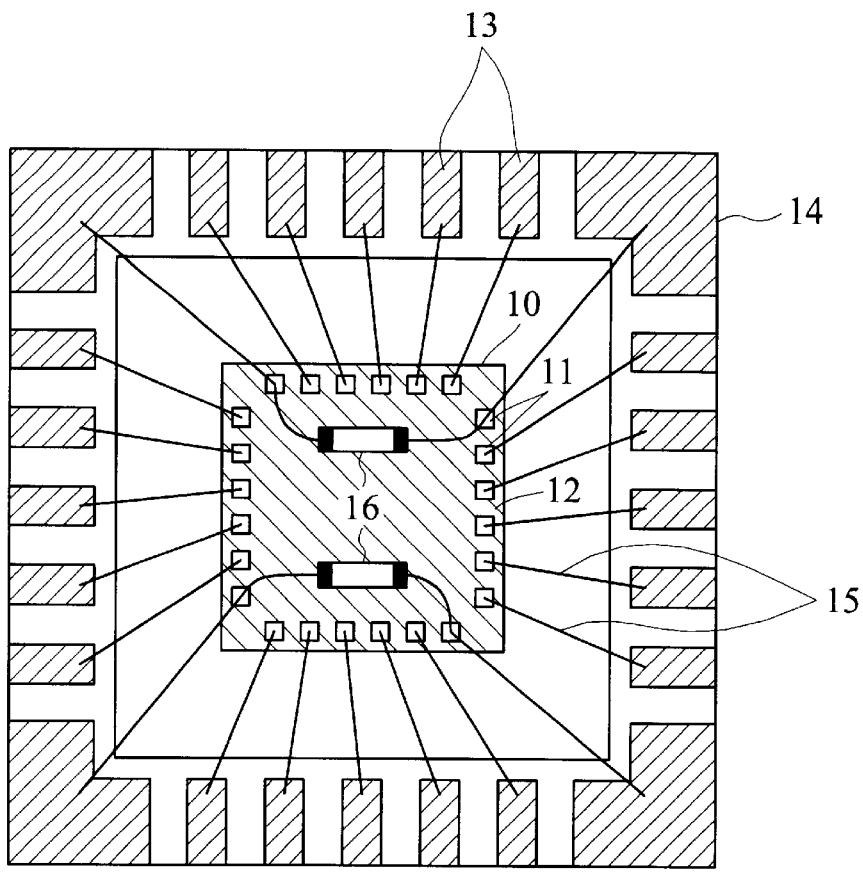
FIG. 3 is a top view showing a semiconductor chip with conventional decoupling capacitors.
Figure 4:
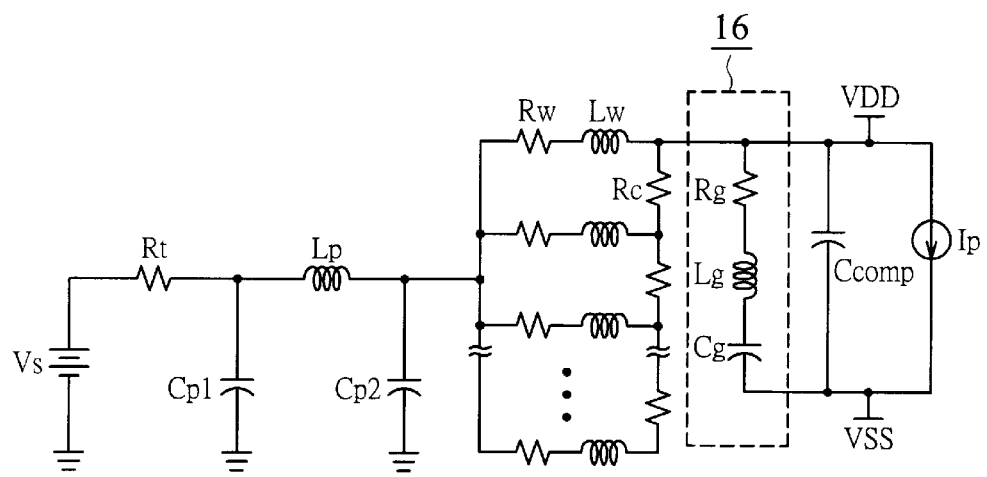
FIG. 4 is a circuit diagram showing an equivalent circuit of FIG. 3.
Figure 5:
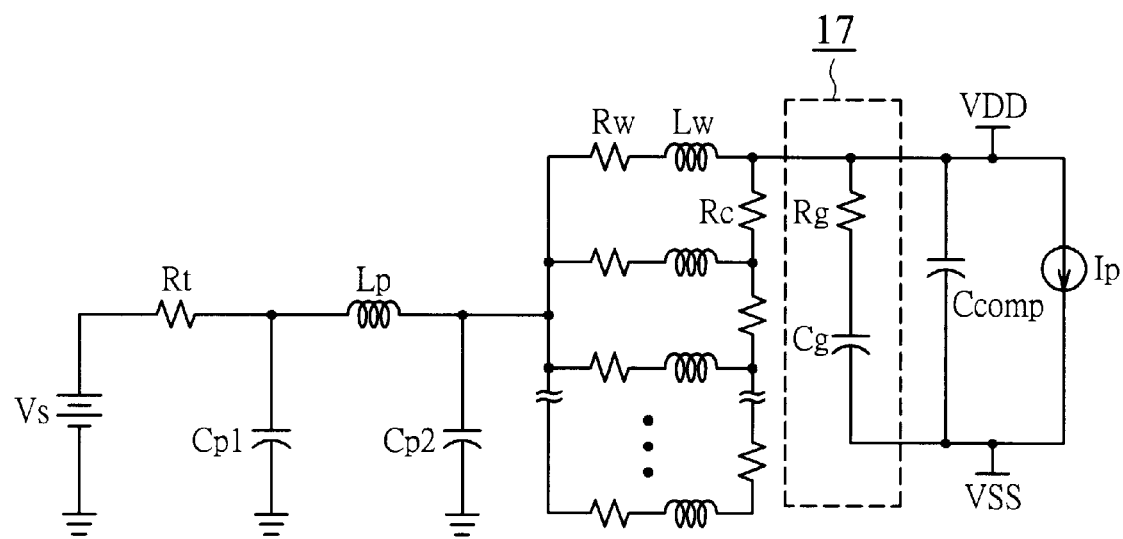
FIG. 5 is a circuit diagram showing an equivalent circuit of a semiconductor chip with an MIM decoupling capacitor.

The inventors have used commercial software of SPICE to simulate the effect of the MLCC, MIM decoupling capacitor, and partially embedded decoupling capacitor on reducing the delta-I noise during operations of the semiconductor chip. Referring back to FIG. 2, assume that $V_s$=2.5 V, $R_r$=10 mΩ, $C_{p1}$=50 pF, $C_{p2}$=100 pF, $L_p$=3 nH, $R_w$=40 mΩ, $L_w$=1 nH, and $R_c$=0.2 Ω in this simulation. In addition, the maximum transient current during operations of the semiconductor chip is set to 400 mA. The simulation results are described in the following Table 1.

TABLE 1

|  | Equivalent Inductance (Lg) | Equivalent Capacitance (Cg) | Maximum Transient Current | VDD Peak Voltage |
|---|---|---|---|---|
| No Decoupling Capacitor | 0 H | 0 F | 400 mA | 1.030 V |
| MLCC | 650 mH | 5 pF | 400 mA | 1.139 V |
|  | 650 mH | 10 pF | 400 mA | 1.185 V |
|  | 650 mH | 15 pF | 400 mA | 1.218 V |
|  | 650 mH | 20 pF | 400 mA | 1.247 V |
| MIM Decoupling Capacitor | 0 H | 5 pF | 400 mA | 1.145 V |
|  | 0 H | 10 pF | 400 mA | 1.200 V |
|  | 0 H | 15 pF | 400 mA | 1.224 V |
|  | 0 H | 20 pF | 400 mA | 1.252 V |
| Partially Embedded Decoupling Capacitor | These conditions and results are the same as MIM decoupling capacitor. | | | |

In Table 1, the VDD peak voltage is calculated under a variety of conditions that the equivalent inductance $L_g$ and the equivalent capacitance $C_g$ are assigned different values. The delta-I noise causes the VDD peak voltage to deviate from the external DC voltage supply $V_s$=2.5V. Accordingly, the semiconductor chip is considered as being well prevented from the delta-I noise when the simulated VDD peak voltage thereof shows much closer to the external DC voltage supply $V_s$. As clearly seen from Table 1, the partially embedded decoupling capacitor according to the present invention successfully enhances the reduction of the delta-I noise for the semiconductor chip. More specifically, the VDD peak voltage is 1.252 V for the semiconductor chip with the partially embedded decoupling capacitor of 20 pF while the VDD peak voltage is 1.030V for the semiconductor chip without any decoupling capacitor. In other words, the delta-I noise is reduced by about 10% for the semiconductor chip with the partially embedded decoupling capacitor compared with the semiconductor chip without any decoupling capacitor. In addition, the partially embedded decoupling capacitor according to the present invention achieves a better effect on reducing the delta-I noise than the conventional MLCC.

It should be noted that although the MIM decoupling capacitor has reduced the same amount of delta-I noise as the partially embedded decoupling capacitor in terms of the VDD peak voltage, as seen from the simulation results of Table 1, when it comes to manufacturing, the partially embedded decoupling capacitor is superior to the MIM decoupling capacitor which needs a lot more additional photolithography steps. Therefore, the partially embedded decoupling capacitor according to the present invention is applicable to every semiconductor chip without changing the original circuit layout and manufacturing process of the semiconductor chip, thereby providing advantages of low cost and high reliability.

In order to further confirm the advantages of the partially embedded decoupling capacitor, the inventors have tested a semiconductor chip without any decoupling capacitor, a semiconductor chip with MLCCs, and a semiconductor chip with partially embedded decoupling capacitors, respectively, to obtain a corresponding maximum operation frequency for each case. In the testing, the capacitance per unit area of the partially embedded decoupling capacitor as used is about 0.007464 $fF/\mu m^2$ and the area of one surface planar metal pattern is about 600 $\mu m \times 700 \mu m$. The testing results are listed in the following Table 2.

TABLE 2

|  | Semiconductor Chip | Semiconductor Chip + MLCC | Semiconductor Chip + Partially Embedded Decoupling Capacitor |
|---|---|---|---|
| Chip Size | 54.76 mm² | 54.76 mm² | 54.76 mm² |
| Power Consumption | 4.5 W | 4.5 W | 4.5 W |
| Capacitance Per Capacitor | 0 | 100 nF | 600 $\mu m$ x 700 $\mu m$ x 0.007464 $fF/\mu m^2$ =3.14 pF |
| Number of Capacitor | 0 | 3 | 6 |
| Total Capacitance | 0 | 300 nF | 18.84 pF |
| Maximum Operation Frequency | 150 Mhz | 190 Mhz | 190 Mhz |

As clearly seen from Table 2, the maximum operation frequency of the semiconductor chip without any decoupling capacitor is about 150 Mhz. In the case where either the MLCCs or the partially embedded decoupling capacitors are provided in the semiconductor chip, the maximum operation frequency thereof is improved up to about 190 Mhz. Although the same maximum operation frequency is obtained, it is necessary for the conventional MLCCs to provide a capacitance level of 300 nF while the partially embedded decoupling capacitor according to the present invention a capacitance level of 18.84 pF. Therefore, the partially embedded decoupling capacitor according to the present invention is superior to the conventional MLCCs for reducing the delta-I noise by using much lower capacitance.

Figure 8:
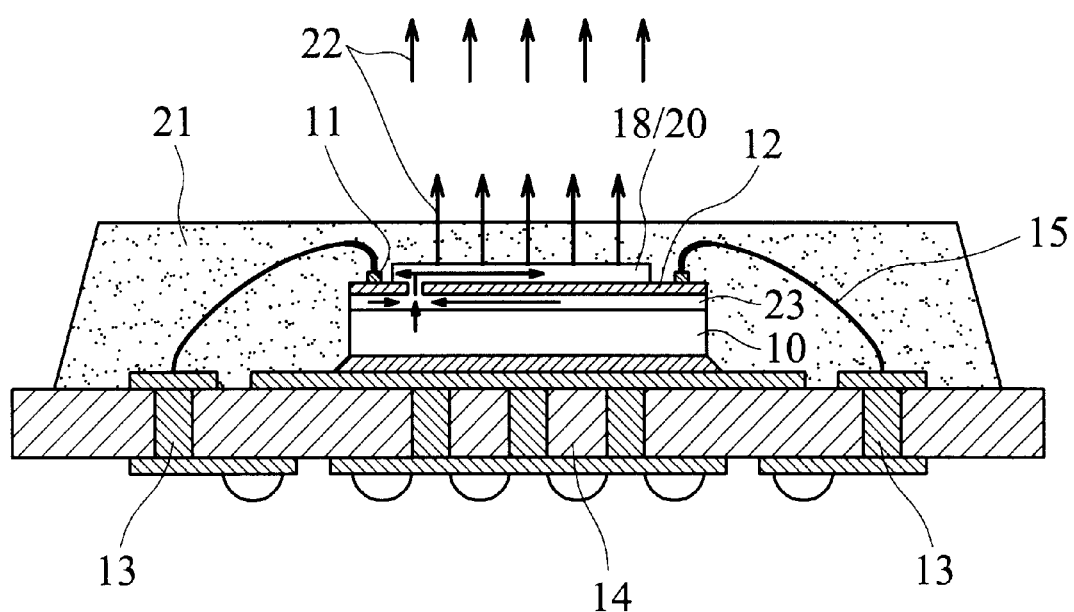
FIG. 8 is a cross-sectional view showing an electronic packaging structure of the semiconductor chip with partially embedded decoupling capacitors.

For the semiconductor chip at a high-speed operation and a high integration density of circuits, the surface planar metal pattern 18 or 20 of the partially embedded decoupling capacitor incidentally provides a better thermal solution. FIG. 8 is a cross-sectional view showing an electronic packaging structure of the semiconductor chip with partially embedded decoupling capacitors. As shown in FIG. 8, the semiconductor chip 10 is mounted on the lead frame 14 in such a way that the bonding pads 11 are connected to the terminals 15 through the bonding wires 15. An encapsulation mold 21 covers the lead frame for encapsulating the semiconductor chip 10.

As indicated by arrows 22, the surface planar metal pattern 18 or 20 formed on the passivation layer 12 also serves as a heat sink for dissipating heat generated during operations of the semiconductor chip 10. Since the surface planar metal pattern 18 or 20 is connected with one of the embedded metal layers 23, a heat-dissipating path is formed from the embedded metal layer 23 directly to the surface planar metal pattern 18 or 20. As a result, the most amount of heat can bypass the passivation layer to the surface planar metal pattern 18 or 20, thereby improving the efficiency of heat dissipation.

According to the present invention, a semiconductor chip capable of reducing the delta-I noise is achieved with the provision of partially embedded decoupling capacitors. Since the formation of the partially embedded decoupling capacitor requires only sputtering, printing, depositing, or the like, a surface planar metal pattern on the top of the semiconductor chip with a corresponding electrical connection to one of the embedded metal layers, the manufacturing process is considerably simple. As a result, the semiconductor chip with partially embedded decoupling capacitors is fabricated at low cost and high reliability. Furthermore, the partially embedded decoupling capacitor according to the present invention is applicable to any semiconductor chip even after the manufacturing process of the semiconductor chip has already been completed.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. A partially embedded decoupling capacitor to reduce delta-I noise for use with a semiconductor chip including a plurality of embedded metal layers, a passivation layer formed above the plurality of embedded metal layers as a topmost layer of the semiconductor chip, and a plurality of bonding pads disposed on the passivation layer, the capacitor comprising:

a surface planar metal pattern formed on the passivation layer and electrically connected to one of the plurality of embedded metal layers, wherein:

the surface planar metal pattern serves as an electrode of the decoupling capacitor, at least one of others of the plurality of embedded metal layers serves as another electrode of the decoupling capacitor, and the passivation layer serves as a dielectric layer of the decoupling capacitor, and the surface planar metal pattern further serves as a heat sink for dissipating heat directly from the inside of the semiconductor chip through the one of the plurality of embedded metal layers electrically connected to the surface planar metal pattern.

2. A partially embedded decoupling capacitor according to claim 1, wherein the surface planar metal pattern is electrically connected to the one of the plurality of embedded metal layers through one of the plurality of bonding pads.

3. A partially embedded decoupling capacitor according to claim 1, wherein:

the semiconductor chip further includes a via hole opened on the passivation layer at a location separated from the plurality of bonding pads, the via hole penetrating the passivation layer down to expose one of the plurality of embedded metal layers, and the surface planar metal pattern covering and filling the via hole so as to be electrically connected to the exposed one of the plurality of embedded metal layers.

4. A partially embedded decoupling capacitor according to claim 1, wherein the one of the plurality of embedded metal layers electrically connected to the surface planar metal pattern is a power layer of the semiconductor chip.

5. A partially embedded decoupling capacitor according to claim 1, wherein the one of the plurality of embedded metal layers electrically connected to the surface planar metal pattern is a ground layer of the semiconductor chip.

6. A semiconductor chip, comprising:

a plurality of embedded metal layers;

a passivation layer formed above the plurality of embedded metal layers as a topmost layer of the semiconductor chip;

a plurality of bonding pads disposed on the passivation layer; and a partially embedded decoupling capacitor to reduce delta-I noise, comprising a surface planar metal pattern formed on the passivation layer and electrically connected to one of the plurality of embedded metal layers, wherein the surface planar metal pattern serves as an electrode of the decoupling capacitor, at least one of others of the plurality of embedded metal layers serves as another electrode of the decoupling capacitor, and the passivation layer serves as a dielectric layer of the decoupling capacitor, and the surface planar metal pattern further serves as a heat sink for dissipating heat directly from the inside of the semiconductor chip through the one of the plurality of embedded metal layers electrically connected to the surface planar metal pattern.

7. A semiconductor chip according to claim 6, wherein the surface planar metal pattern is electrically connected to the one of the plurality of embedded metal layers through one of the plurality of bonding pads.

8. A semiconductor chip according to claim 6, further comprising:

a via hole opened on the passivation layer at a location separated from the plurality of bonding pads, the via hole penetrating the passivation layer down to expose one of the plurality of embedded metal layers, wherein the surface planar metal pattern covering and filling the via hole so as to be electrically connected to the exposed one of the plurality of embedded metal layers.

9. A semiconductor chip according to claim 6, wherein the one of the plurality of embedded metal layers electrically connected to the surface planar metal pattern is a power layer of the semiconductor chip.

10. A semiconductor chip according to claim 6, wherein the one of the plurality of embedded metal layers electrically connected to the surface planar metal pattern is a ground layer of the semiconductor chip.

11. An electronic packaging structure comprising;

a lead frame having a plurality of terminals, a semiconductor chip as set forth in claim 6 mounted on the lead frame in such a way that the plurality of bonding pads are electrically connected to the plurality of terminals; and an encapsulation mold covering the lead frame for encapsulating the semiconductor chip therewith.

12. An electronic packaging structure according to claim 11, wherein the surface planar metal pattern is electrically connected to the one of the plurality of embedded metal layers through one of the plurality of bonding pads.

13. An electronic packaging structure according to claim 11, wherein:

the semiconductor chip further includes a via hole opened on the passivation layer at a location separated from the plurality of bonding pads, the via hole penetrating the passivation layer down to expose one of the plurality of embedded metal layers, and the surface planar metal pattern covering and filling the via hole so as to be electrically connected to the exposed one of the plurality of embedded metal layers.

14. An electronic packaging structure according to claim 11, wherein the one of the plurality of embedded metal layers electrically connected to the surface planar metal pattern is a power layer of the semiconductor chip.

15. An electronic packaging structure according to claim 11, wherein the one of the plurality of embedded metal layers electrically connected to the surface planar metal pattern is a ground layer of the semiconductor chip.

16. An electronic packaging structure according to claim 11, wherein the plurality of bonding pads are electrically connected to the plurality of terminals through a plurality of bonding wires.

* * * * *